US011783890B2

(12) United States Patent
Fujiwara et al.

(10) Patent No.: US 11,783,890 B2
(45) Date of Patent: *Oct. 10, 2023

(54) SEMICONDUCTOR DEVICE INCLUDING DISTRIBUTED WRITE DRIVING ARRANGEMENT

(71) Applicant: TAIWAN SEMICONDUCTOR MANUFACTURING COMPANY, LTD., Hsinchu (TW)

(72) Inventors: Hidehiro Fujiwara, Hsinchu (TW); Hung-Jen Liao, Hsinchu (TW); Li-Wen Wang, Hsinchu (TW); Jonathan Tsung-Yung Chang, Hsinchu (TW); Yen-Huei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/816,048

(22) Filed: Jul. 29, 2022

(65) Prior Publication Data
US 2022/0366965 A1 Nov. 17, 2022

Related U.S. Application Data

(63) Continuation of application No. 17/241,687, filed on Apr. 27, 2021, now Pat. No. 11,423,974, which is a
(Continued)

(51) Int. Cl.
*G11C 11/4094* (2006.01)
*G11C 7/12* (2006.01)
(Continued)

(52) U.S. Cl.
CPC .......... *G11C 11/4094* (2013.01); *G11C 5/063* (2013.01); *G11C 7/12* (2013.01);
(Continued)

(58) Field of Classification Search
CPC ....... G11C 11/4094; G11C 5/063; G11C 7/12; G11C 11/4096; G11C 11/419;
(Continued)

(56) References Cited

U.S. PATENT DOCUMENTS 7,663,942 B2 * 2/2010 Kushida ................... G11C 7/18
365/230.02
7,675,768 B1 * 3/2010 Kim ....................... G11C 23/00
365/207

(Continued)

FOREIGN PATENT DOCUMENTS

TW 201539471 10/2015

OTHER PUBLICATIONS

Office Action dated Apr. 30, 2020 from corresponding application No. TW 108124568.
(Continued)

*Primary Examiner* — Fernando Hidalgo
(74) *Attorney, Agent, or Firm* — Hauptman Ham, LLP

(57) ABSTRACT

A semiconductor memory device includes: a local write bit (LWB) line; a local write bit_bar (LWB_bar) line; a global write bit (GWB) line; a global write bit_bar (GWBL_bar) line; a column of segments, each segment including bit cells that are connected correspondingly between the LWB and LWB_bar lines; and a distributed write driving arrangement including a global write driver and local write drivers included correspondingly in the segments; and the global write driver including a first equalizer circuit, arranged in a switched-coupling between the LWB line and the LWB_bar line, and arranged in a control-coupling with respect to signals correspondingly on the GWB line and the GWB_bar line, and the global write driver and the local write drivers each including first inversion couplings (coupled in parallel between the GWB line and the LWB line) and second
(Continued)

inversion couplings (coupled in parallel between the GWB_bar line and the LWB_bar line).

20 Claims, 11 Drawing Sheets

Related U.S. Application Data continuation of application No. 16/991,449, filed on Aug. 12, 2020, now Pat. No. 10,991,420, which is a continuation of application No. 16/503,344, filed on Jul. 3, 2019, now Pat. No. 10,755,768.

(60) Provisional application No. 62/698,517, filed on Jul. 16, 2018.

(51) Int. Cl.
| | | |
|---|---|---|
| *G11C 11/4096* | (2006.01) | |
| *G11C 5/06* | (2006.01) | |
| *G11C 11/419* | (2006.01) | |
| *H01L 21/48* | (2006.01) | |
| *H10B 10/00* | (2023.01) | |

(52) U.S. Cl.
CPC ........ *G11C 11/4096* (2013.01); *G11C 11/419* (2013.01); *H01L 21/4889* (2013.01); *H10B 10/18* (2023.02)

(58) Field of Classification Search
CPC ....... G11C 7/1096; G11C 7/18; G11C 7/1048; G11C 11/412; H01L 21/4889; H10B 10/18
USPC .......................................... 438/584; 365/203
See application file for complete search history.

(56) References Cited

U.S. PATENT DOCUMENTS

| | | | | |
|---|---|---|---|---|
| 7,839,704 | B2* | 11/2010 | Murata ................. | G11C 11/413 |
| | | | | 365/189.16 |
| 7,924,605 | B2* | 4/2011 | Fujimoto ................. | G11C 7/18 |
| | | | | 365/156 |
| 9,947,388 | B2* | 4/2018 | Kulkarni ............... | G11C 11/419 |
| 10,755,768 | B2* | 8/2020 | Fujiwara ............. | H01L 21/4889 |
| 10,991,420 | B2* | 4/2021 | Fujiwara ................ | G11C 5/063 |
| 11,423,974 | B2* | 8/2022 | Fujiwara ............. | H01L 21/4889 |
| 2014/0219039 | A1 | 8/2014 | Jung et al. | |

OTHER PUBLICATIONS

Notice of Allowance dated Dec. 28, 2020 from corresponding application No. KR10-2019-0085839.

* cited by examiner

US 11,783,890 B2

SEMICONDUCTOR DEVICE INCLUDING DISTRIBUTED WRITE DRIVING ARRANGEMENT

PRIORITY CLAIM

The instant application is a continuation application of U.S. application Ser. No. 17/241,687, filed Apr. 27, 2021, now U.S. Pat. No. 11,423,974, issued Aug. 23, 2022, which is a continuation application of U.S. application Ser. No. 16/991,449, filed Aug. 12, 2020, now U.S. Pat. No. 10,991,420, issued Apr. 27, 2021, which is a continuation application of U.S. application Ser. No. 16/503,344, filed Jul. 3, 2019, now U.S. Pat. No. 10,755,768, issued Aug. 25, 2020, which is a non-provisional application claiming priority to Provisional Application No. 62/698,517, filed Jul. 16, 2018, the entire contents of which are incorporated by reference herein.

BACKGROUND

In a typical memory system, memory cells are arranged in an array. Each memory cell (also referred to as a cell) stores a datum representing one bit. Each cell is at the intersection of a row and a column. Accordingly, a particular cell is accessed by selection of the row and the column which intersect at the particular cell. Each of the cells in a column is connected to a bit line. An input/output (I/O) circuit uses the bit line to read a datum from, or write a datum to, a selected one of the bit cells in the column.

Typically, there are many cells in a column. Due to varying physical distances between the I/O circuit and the cells, the bit line represents a different resistive and/or capacitive load for each of the cells in the column.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
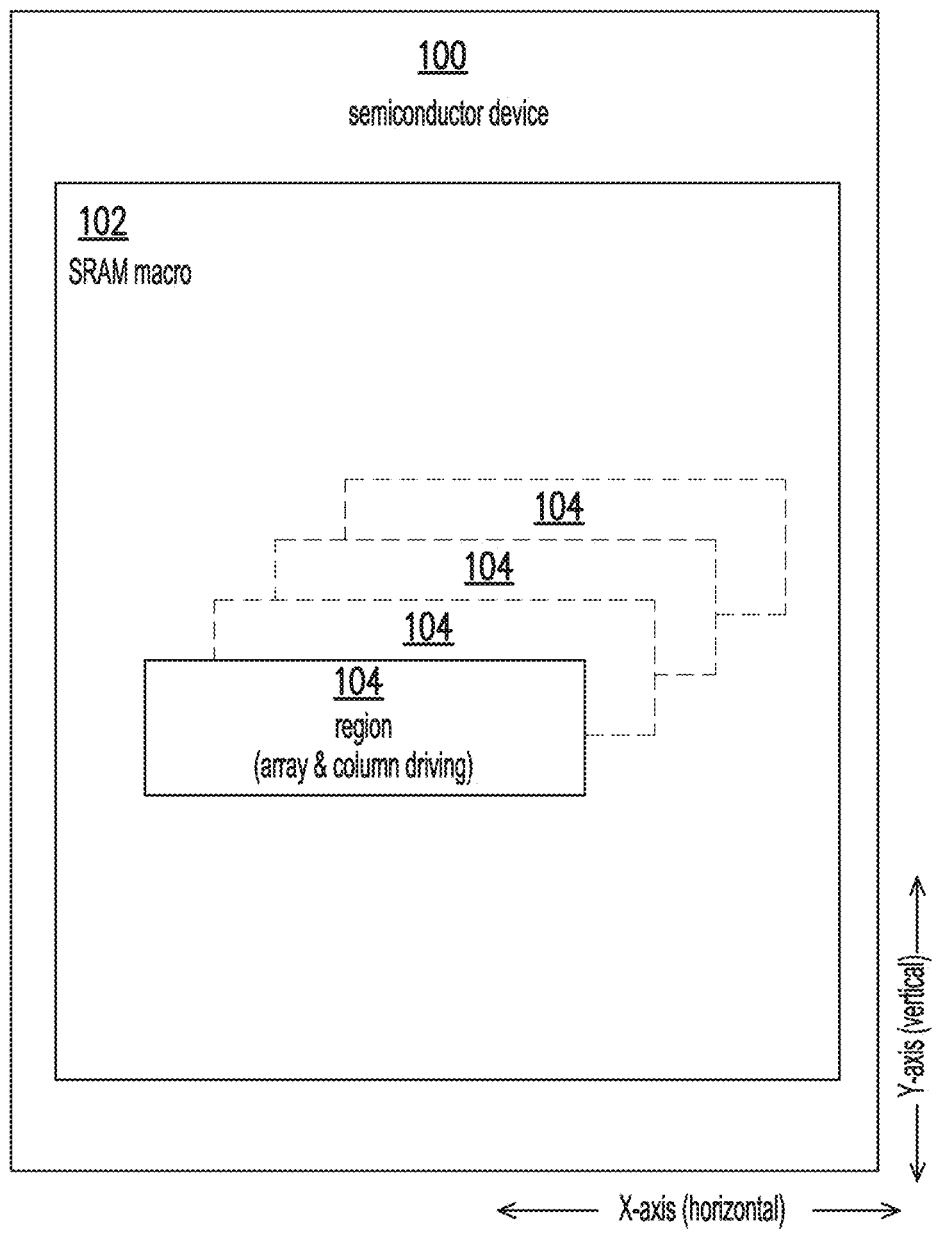
FIG. 1 is a block diagram of a semiconductor device, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, for SRAM bit cells which include separate write and read ports, a distributed write driving arrangement is provided. More particularly, such a distributed write driving arrangement includes: a global write driver; and, in each segment of bit cells, a local write driver. The global write driver includes: a first inverter connected between a global write bit (GWB) line and a local write bit (LWB) line; and a second inverter connected between a global write bit_bar (GWB_bar) line and a local write bit_bar (LWB_bar) line. Each local write driver includes: a third inverter connected between the GWB line and the LWB line; and a fourth inverter connected between the GWB_bar line and the LWB_bar line. In some embodiments, a distributed write driving arrangement, which includes each local write driver being in the corresponding segment of bit cells, has a benefit of mitigating a problem of resistive and/or capacitive loading of the LWB line and the LWB_bar line. In some embodiments, each local write driver is in a first device layer and the global write driver is in a second device layer over the first device layer, which confers a benefit that the global write driver is more easily configured for high speed and a large footprint than a circumstance in which the global write driver is in the first device layer.

FIG. 1 is a block diagram of a semiconductor device 100, in accordance with at least one embodiment of the present disclosure.

In FIG. 1, semiconductor device 100 includes, among other things, a circuit macro (hereinafter, macro) 102. In some embodiments, macro 102 is an SRAM macro. In some embodiments, macro 102 is a macro other than an SRAM macro. Macro 102 includes, among other things, one or more array & column driving regions 104, each of which includes a distributed write driving arrangement. An example of region 104 is array & column driving region 200 of FIG. 2.

Figure 2:
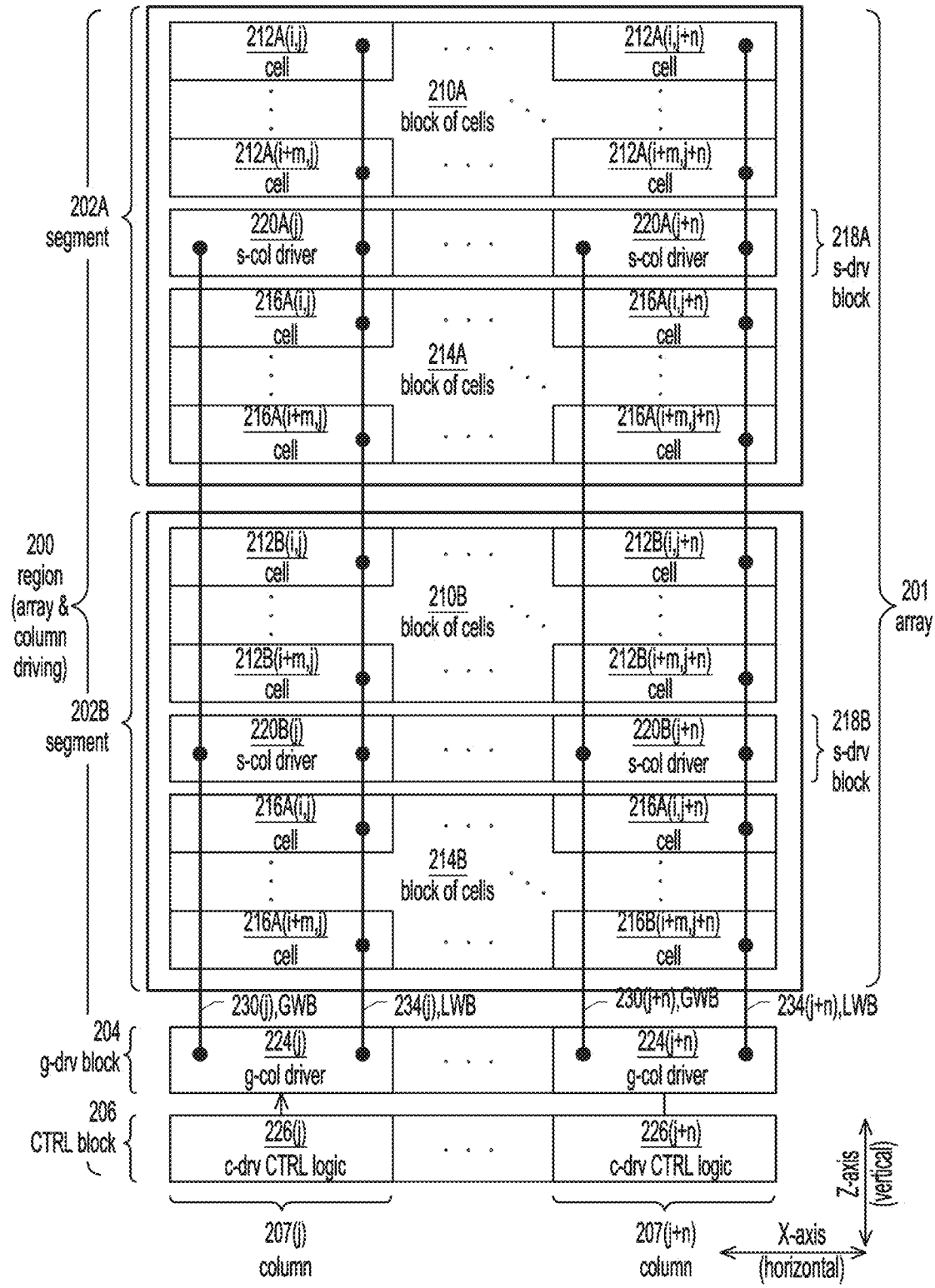
FIG. 2 is a block diagram of an array & column driving region which includes a distributed write driving arrangement, in accordance with at least one embodiment of the present disclosure.

FIG. 2 is a block diagram of array & column driving region 200 which includes a distributed write driving arrangement, in accordance with at least one embodiment of the present disclosure. Region 200 of FIG. 2 is an example of region 104 of FIG. 1.

In FIG. 2, region 200 is organized into columns, with columns 207(*j*) through 207(*j*+n) being shown in FIG. 2, where j and n are integers and j≥0, n≥1 and j indicates a column number. Region 200 includes segments 202A and 202B, a global driving (g-drv) block 204; and a control block 206.

Segment 202A includes: a block 210A; a segment-driving (s-drv) block 218A; and a block 214A. Segment 202B includes: a block 210B; a s-drv block 218B; and a block 214B.

Block 210A is organized as a two-dimensional array of rows and columns, the array including bit cells 212A(i,j) through 212A(i+m,j+n), where i and m are integers, i≥0, m≥1, and i indicates a row number. Bit cells, e.g., bit cell 212A(i,j) are shown in more detail in FIG. 3 (discussed below). For example, bit cells 212A(i,j) through 212A(i+m, j) are in column 207(*j*). Block 214A is organized as a two-dimensional array including bit cells 216A(i,j) through 216A(i+m,j+n). Block 210B is organized as a two-dimensional array including bit cells 212B(i,j) through 212B(i+m,j+n). Block 214B is organized as a two-dimensional array including bit cells 216B (i,j) through 216B (i+m,j+n).

S-drv block 218A includes local write drivers 220A(j) through 220A(j+n) referred to as segment-column (s-col) drivers 220A(j) through 220A(j+n). S-col drivers, e.g., s-col driver 220A(j), are shown in more detail in FIG. 3 (discussed below). For example, s-col driver 220A(j) is in column 207(*j*). S-drv block 218B includes local write drivers 220B (j) through 220B(j+n) referred to as s-col drivers 220B(j) through 220B(j+n).

Global driving (g-drv) block 204 includes global write drivers 224(*j*) through 224(*j*+n) referred to as global-column (g-col) drivers 224(*j*) through 224(*j*+n). G-col drivers, e.g., g-col driver 224(*j*), are shown in more detail in FIG. 3 (discussed below). For example, g-col driver 224(*j*) is in column 207(*j*).

In FIG. 2, because region 200 includes global driving (g-drv) block 204 and s-drv blocks 218A-218B (the latter being correspondingly included in segments 202A-202B), region 200 is regarded as having a distributed write driving arrangement.

Control block 206 includes column driving (c-drv) control units 226(*j*) through 226(*j*+n). Control units, e.g., c-drv control unit 226(*j*), are shown in more detail in FIG. 3 (discussed below). For example, c-drv control unit 226(*j*) is in column 207(*j*). C-drv control unit 226(*j*)-226(*j*+n) provide corresponding write-control signals (see FIG. 3, discussed below).

Region 200 further includes: global write bit (GWB) lines 230(*j*) through 230(*j*+n); corresponding global write bit_bar (GWB_bar) lines (not shown, but see FIG. 3 discussed below); local write bit (LWB) lines 234(*j*) through 234(*j*+n); and corresponding local write bit_bar (LWB_bar) lines (not shown, but see FIG. 3 discussed below).

In region 200 of FIG. 2, GWB line 230(*j*) is connected to each of s-col driver 220A(j), s-col driver 220B(j) and g-col driver 224(*j*). GWB line 230(*j*+n) is connected to each of s-col driver 220A(j+n), s-col driver 220B(j+n) and g-col driver 224(*j*+n), and the like. LWB line 234(*j*) is connected to each of bit cells 212A(i,j)-212A(i+m,j), s-col driver 220A(j), bit cells 216A(i,j)-216A(i+m,j), bit cells 212B(i,j)-212B(i+m,j), s-col driver 220B(j), bit cells 216B(i,j)-216B (i+m,j) and g-col driver 224(*j*). LWB line 234(*j*+n) is connected to each of bit cells 212A(i,j+n)-212A(i+m,j+n), s-col driver 220A(j+n), bit cells 216A(i,j+n)-216A(i+m,j+n), bit cells 212B(i,j+n)-212B(i+m,j+n), s-col driver 220B(j+n), bit cells 216B(i,j+n)-216B(i+m,j+n) and g-col driver 224(*j*+n), and the like.

For simplicity of illustration, region 200 of FIG. 2 has been shown with two segments, 202A-202B. In some embodiments, additional segments are included in region 200. Also for simplicity of illustration, each of segments, 202A-202B has been shown with one s-drv block, namely corresponding s-drv blocks 218A-218B, such that an intra-segment ratio of blocks of cells (bcell) to s-drv blocks (bsdrv) is bcell:bsdrv=2:1. Other ratios are within the scope of the disclosure. In some embodiments, intra-segment ratios bcell:bsdrv have values other than bcell:bsdrv=2:1.

Figure 3:
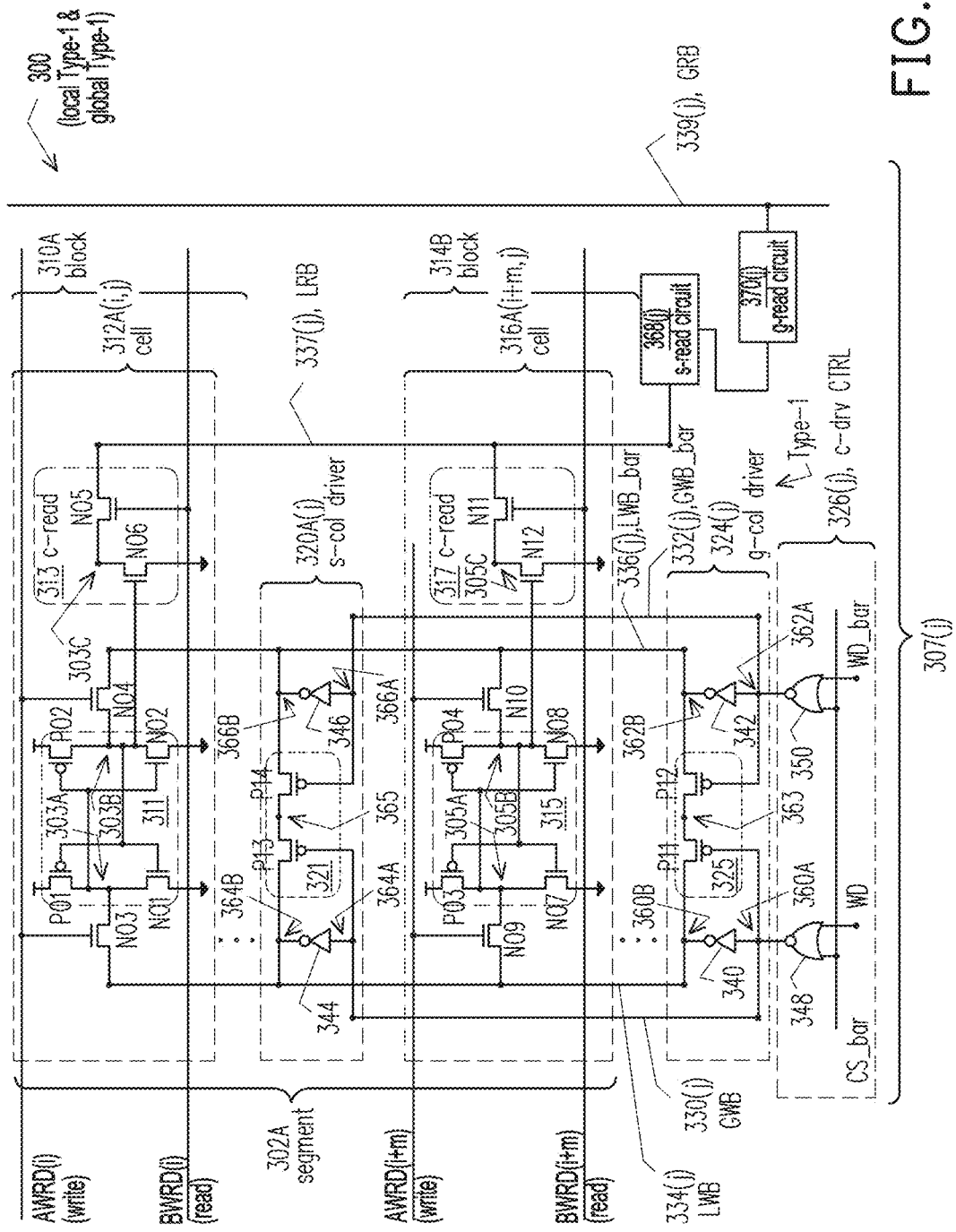
FIG. 3 is a circuit diagram of an array & column driving region which includes a distributed write driving arrangement, in accordance with at least one embodiment of the present disclosure.

FIG. 3 is a circuit diagram 300 of an array & column driving region which includes a distributed write driving arrangement, in accordance with at least one embodiment of the present disclosure.

Circuit diagram 300 is an example implementation of array & column driving region 200 of FIG. 2. As such, circuit diagram 300 is an example of region 104 of FIG. 1.

While circuit diagram 300 of FIG. 3 is more detailed in some respects than the block diagram of region 200 of FIG. 2, e.g., because the circuit diagram depicts transistors, inverters, NOR gates, a GWB_bar line 332(*j*); a LWB_bar line 336(*j*), or the like, the circuit diagram also represents a simplification of the block diagram of region 300. For the sake of simplicity of illustration, simplifications in circuit diagram 300 include: one column 307(*j*) rather than multiple columns corresponding to all of columns 207(*j*)-207(*j*+n) of region 200; one segment 302A rather than two segments corresponding to segments 202A-202B in region 200; one bit cell 312A(i,j) in block 310A rather than multiple bit cells corresponding to all of bit cells 212A(i,j)-212A(i+m,j+n) in block 210A of segment 202A of region 200; one s-col driver 320A(j) rather than multiple s-col drivers corresponding to s-col drivers 220A(j)-220A(j+n) in s-drv block 218A in region 200; one bit cell 316A(i+m,j) in block 310B rather than multiple bit cells corresponding to all of bit cells 216A(i,j)-216A(i+m,j+n) in block 214A of segment 202A of region 200; one g-col driver 324(*j*) rather than multiple g-col drivers corresponding to g-col drivers 224(*j*)-224(*j*+n) in region 200; one c-drv control unit 326(*j*) rather than multiple c-drv control units corresponding to c-drv control units 226(*j*)-226(*j*+n) in region 200; GWB line 330(*j*) rather than multiple GWB lines corresponding to GWB lines 230(*j*)-230(*j*+n) in region 200; and LWB line 334(*j*) rather than multiple LWB lines corresponding to LWB lines 234(*j*)-234 (*j*+n) in region 200.

In FIG. 3, bit cells 312A(i,j) and 316A(i+m,j) are dual port, 8 transistor (8T) SRAM bit cells, with one port representing a write port and one port representing a read port. Other bit cell configurations are within the scope of the disclosure. In some embodiments, bit cells 312A(i,j) and 316A(i+m,j) are multi-port SRAM bit cells other than dual port SRAM bit cells. In some embodiments, bit cells 312A (i,j) and 316A(i+m,j) are implemented with a number of transistors different than 8 transistors.

In circuit diagram 300, bit cell 312A(i,j) includes PMOS transistors P01-P02 and NMOS transistors N01-N06. Transistors P01-P02 and N01-N02 are configured as an SRAM latch 311. Transistors N03 and N04 represent switches (referred to as pass gates) which selectively connect node 303A and node_bar 303B of latch 311 to corresponding LWB line 334(j) and LWB_bar line 336(j). Gate electrodes of transistors N03 and N04 are connected to an $i^{th}$ word write line (WRD) A (AWRD(i)). A signal on AWRD(i) is used to select when transistors N03 and N04 are ON/OFF and thereby select when node 303A and node_bar 303B of latch 311 is connected to corresponding LWB line 334(j) and LWB_bar line 336(j).

In particular regarding latch 311, transistors P01 and N01 are connected in series between a first reference voltage and a second reference voltage. In some embodiments, the first reference voltage is VDD. In some embodiments, the second reference voltage is VSS. Source and drain electrodes of transistor P01 are connected correspondingly to VDD and node 303A. Drain and source electrodes of transistor N01 are connected correspondingly to node 303A and VSS. Transistors P02 and N02 are connected in series between VDD and VSS. Source and drain electrodes of transistor P02 are connected correspondingly to VDD and node_bar 303B. Drain and source electrodes of transistor N02 are connected correspondingly to node_bar 303B and VSS. Gate electrodes of each of transistors P01 and N01 are connected to node_bar 303B. Gate electrodes of each of transistors P02 and N02 are connected to node 303A.

In circuit diagram 300, bit cell 316A(i+m,j) includes PMOS transistors P03-P04 and NMOS transistors N07-N12. Bit cell 316A(i+m,j) is similar to bit cell 312A(i,j). For the sake of brevity, the discussion of bit cell 316A(i+m,j) will focus on differences with respect to bit cell 312A(i,j).

In bit cell 316A(i+m,j), transistors P03-P04 and N07-N08 are configured as an SRAM latch 315. Transistors N09 and N10 represent switches (referred to as pass gates) which selectively connect nodes 305A and 305B of latch 315 to corresponding LWB line 334(j) and LWB_bar line 336(j) under the control of a signal on line AWRD(i+m).

In FIG. 3, g-col driver 324(j) includes: inverters 340 and 342, and an equalizer 325. Inverter 340 is connected between GWB line 330(j) at a node 360A and LWB line 334(j) at a node 360B. Inverter 342 is connected between GWB_bar line 332(j) at a node 362A and LWB_bar line 336(j) at a node 362B.

Equalizer 325 is connected between LWB line 334(j) at node 360B and LWB_bar line 336(j) at node 362B. Equalizer 325 includes PMOS transistors P11 and P12 connected in series between LWB line 334(j) at node 360B and LWB_bar line 336(j) at node 362B. Source/drain electrodes of transistor P11 are connected to node 360B and a node 363. Source/drain electrodes of transistor P12 are connected to node 363 and node 362B. Gate electrodes of transistors P11 and P12 are connected to corresponding nodes 360A and 362A.

In FIG. 3, s-col driver 320A(j) includes: inverters 344 and 346, and an equalizer 321. Inverter 344 is connected between GWB line 330(j) at a node 364A and LWB line 334(j) at a node 364B. Inverter 346 is connected between GWB_bar line 332(j) at a node 366A and LWB_bar line 336(j) at a node 366B. Inverters 344 and 346, which are included in s-col driver 320A(j), accordingly are physically at the interior of segment 302A.

Equalizer 321 is connected between LWB line 334(j) at node 364B and LWB_bar line 336(j) at node 366B. Equalizer 321 includes PMOS transistors P13 and P14 connected in series between LWB line 334(j) at node 364B and LWB_bar line 336(j) at node 366B. Source/drain electrodes of transistor P13 are connected to node 364B and a node 365. Source/drain electrodes of transistor P14 are connected to node 365 and node 366B. Gate electrodes of transistors P13 and P14 are connected to corresponding nodes 364A and 366A.

In FIG. 3, c-drv control unit 326(j) includes a NOR gate 348 and a NOR gate 350. The outputs of NOR gates 348-350 are connected to corresponding nodes 360B and 362B. A first input of each of NOR gates 348-350 is connected to a column select_bar (CS_bar) line. A second input of NOR gate 348 is connected to a write data (WD) line. A second input of NOR gate 350 is connected to a write data_bar (WD_bar) line. By using NOR gates 348-350, c-drv control unit 326(j) reflects an 'active-low' configuration. In some embodiments, c-drv control unit 326(j) reflects an 'active-high' configuration. In some embodiments in which c-drv control unit 326(j) reflects an active-high configuration, c-drv control unit 326(j) includes corresponding NAND gates in place of NOR gates 348-350.

In the context of an array and column driving region in an SRAM device according to another approach, and more specifically in the context of one column thereof, it is noted that the other approach does not use a distributed driving arrangement but instead uses a consolidated driving arrangement. As such, the other approach does not include a local write driver in each corresponding segment of bit cells, nor a GWB line, nor a GWB_bar line, and has a consolidated driver (not shown) in place of g-col driver 324(j) and c-drv control unit 326(j). The problem of resistive and/or capacitive loading of the LWB line and the LWB_bar line significantly impairs operation of the arrangement according to the other approach.

For example, according to the other approach, during a write process in which a column is selected and a segment is selected, the LWB line is pre-charged to a logical high value (value H). After pre-charging, the consolidated driver drives the LWB line with either a value H or a logical low value (value L). Consider a write scenario, according to the other approach, in which the node of the latch (of the bit cell) initially stores value H such that the NMOS transistor connected to the node is turned off because the node_bar stores a corresponding value L, the node of the latch (of the bit cell) is selected to be connected to the LWB line, and the consolidated driver attempts to drive/write the LWB line with a value L. In the write scenario according to the other approach, the NMOS transistor will be turned on and will attempt to pull the LWB line from the pre-charge value H down to value L. The resistive and/or capacitive loading of the LWB line significantly impairs the ability of the corresponding NMOS transistor in the latch of the other approach to pull the WRB line from the pre-charge value H down to value L.

In some embodiments, the distributed write driving arrangement of region 200 has a benefit of mitigating a problem of resistive and/or capacitive loading of LWB line 334(j) and LWB_bar line 336(j). In particular, inverters 344 and 346 are included in s-col driver 320A(j) and accordingly are at the interior of segment 302A. Inverters 344 and 346 supplement the driving ability of inverters 340 and 342 of g-col driver 324(j), which mitigates the problem of resistive and/or capacitive loading of LWB line 334(j) and LWB_bar line 336(j). The operation of c-drv control unit 326(j), g-col driver 324(j) and s-col driver 320A(j) is discussed below in the context of FIGS. 4A-4C.

Circuit diagram 300 of FIG. 3 further includes a local read bit (LRB) line 337(j), a segment read (s-read) circuit 368(j), a global read (g-read) circuit 370(j) and a global read bit (GRB) line 339(j). Also in bit cell 312A(i,j), transistors N05 and N06 are connected as cell-read (c-read) circuit 313.

Regarding c-read circuit 313, transistors N05 and N06 are connected in series between a local read bit (LRB) line 337(j) and VSS. First and second source/drain electrodes of transistor N05 are connected to LRB line 337(j) and a node 303C. First and second source/drain electrodes of transistor N06 are connected to node 303C and VSS. The gate electrode of transistor N05 is connected to an $i^{th}$ word read bit (WRB) B (BWRD(i)). A signal on BWRD(i) is used to select when transistor N05 is ON/OFF and thereby select when node 303C of latch 311 is connected to LRB line 337(j). The gate electrode of transistor N06 is connected to node_bar 303B of latch 311.

In some embodiments, during a read process in which column 307(j) is selected and segment 302A is selected, LRB line 337(j) is pre-charged to a logical high value (value H). After pre-charging, LRB line 337(j) is connected by s-read circuit 368(j) and g-read circuit 370(j) to GRB line 339(j). Also after pre-charging, the signal on BWRD(i) line is used to turn on transistor N05. In a first read scenario, in which node 303A of latch 311 stores a logical low value (value L)) and node_bar 303B of latch 311 correspondingly stores a value H, the value H on node_bar 303B will turn on transistor N06. Accordingly, in the first read scenario, transistors N05 and N06 together connect LRB line 337(j) to VSS, resulting in LRB line 337(j) taking on a value L, which reflects the value L stored at node 303A of latch 311. In a second read scenario, in which node 303A of latch 311 stores a value H and node_bar 303B of latch 311 correspondingly stores a value L, the value L on node_bar 303B will turn off transistor N06. Accordingly, in the second read scenario, transistor N06 prevents LRB line 337(j) from being connected to VSS, resulting in LRB line 337(j) retaining the value H, which reflects the value H stored at node 303A of latch 311.

Also in bit cell 316A(i+m,j), transistors N11 and N12 are connected as c-read circuit 317. C-read circuit 317 is similar to c-read circuit 313. For the sake of brevity, the discussion of c-read circuit 317 will focus on differences with respect to c-read circuit 313.

Regarding c-read circuit 313, first and second source/drain electrodes of transistor N11 are connected to LRB line 337(j) and a node 305C. First and second source/drain electrodes of transistor N12 are connected to node 305C and VSS. Transistor N11 selectively connects LRB line 337(j) to node 305C under the control of a signal on line BWRD(i+m). Transistor N12 selectively connects node 305C to VSS under the control of a logical value (L or H) stored at node 305B of latch 315.

Figure 4A:
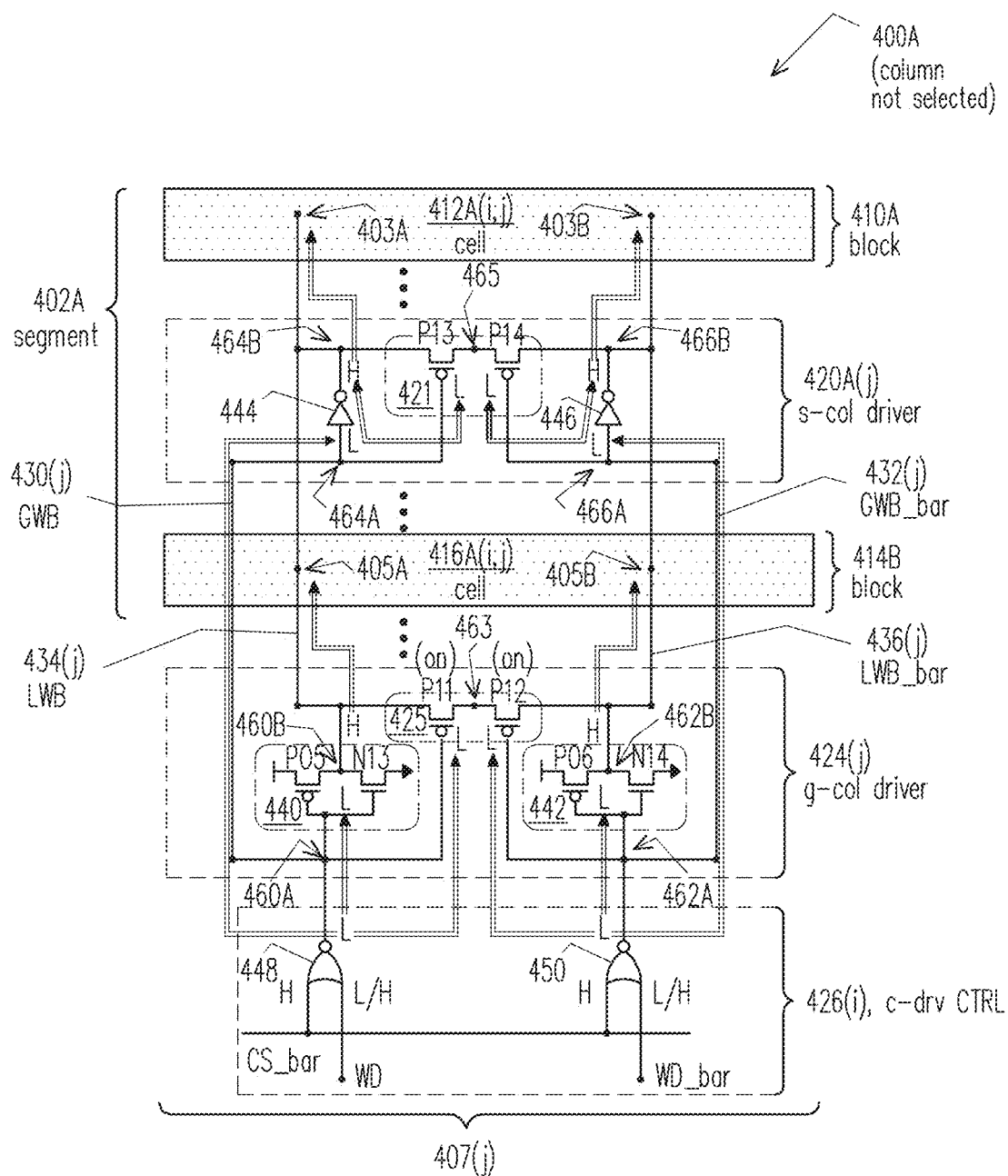
FIGS. 4A-4C are corresponding circuit diagrams of an array & column driving region which includes a distributed write driving arrangement, in accordance with at least one embodiment of the present disclosure.
Figure 4B:
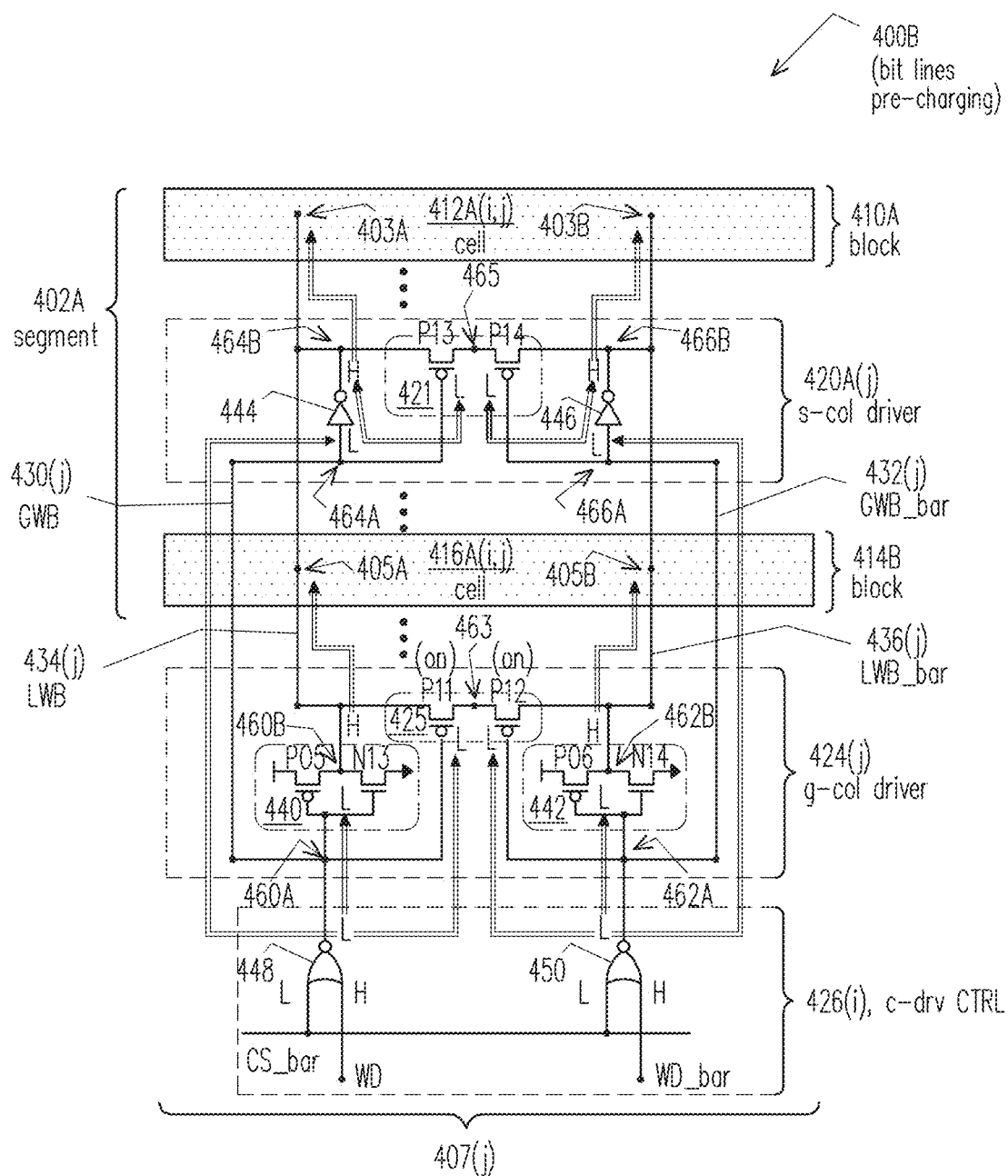
Figure 4C:
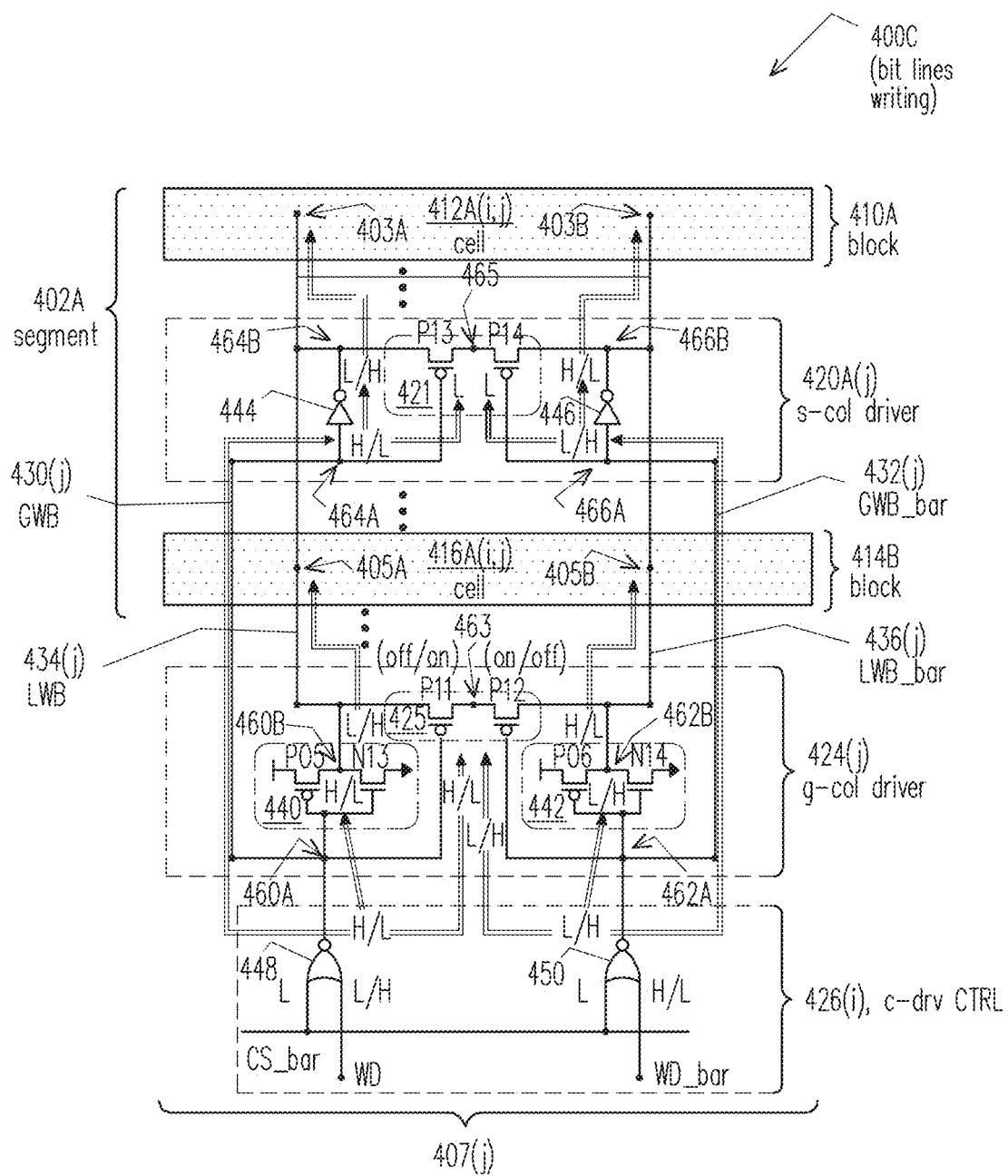

FIGS. 4A-4C are corresponding circuit diagrams 400A-400C of an array & column driving region which includes a distributed write driving arrangement, in accordance with at least one embodiment of the present disclosure. More particularly, each of circuit diagrams 400A-400C shows the same circuit albeit in different control phases of column 407(j) of the array & column driving region.

Each of circuit diagrams 400A-400C is an example implementation of array & column driving region 200 of FIG. 2. As such, each of circuit diagrams 400A-400C is an example of region 104 of FIG. 1.

In some respects, each of circuit diagrams 400A-400C is a more detailed version of circuit diagram 300. For example, each of circuit diagrams 400A-400C shows: inverter 440 as including PMOS transistor P05 connected and NMOS transistor N13, with source/drain electrodes of transistor P05 connected between VDD and a node 460B, and source/drain electrodes of transistor N13 connected between node 460B and VSS; and inverter 442 as including PMOS transistor P06 connected and NMOS transistor N14, with source/drain electrodes of transistor P06 connected between VDD and a node 462B, and source/drain electrodes of transistor N14 connected between node 462B and VSS. In some respects, for simplicity of illustration, each of circuit diagrams 400A-400C is a less detailed version of circuit diagram 300. While each of circuit diagrams 400A-400C shows cells 412A(i,j) and 416A(i,j), each of circuit diagrams 400A-400C does not show components included in each of cells 412A(i,j) and 416A(i,j).

FIG. 4A assumes a scenario in which column 407(j) is not selected. FIG. 4B assumes a scenario in which column 407(j) is selected and in which column 407(j) is being pre-charged before a write operation. FIG. 4C assumes a scenario in which column 407(j) is selected, and in which data is being written to column 407(j), after column 407(j) has been pre-charged.

Regarding FIG. 4A (which assumes, again, a scenario in which column 407(j) is not selected), because the inclusion of NOR gates 448-450 in c-drv control unit 426(i) reflects an 'active-low' configuration, column 407(j) is not selected when a signal on line CS_BAR is set to value H. When the signal on line CS_BAR is set to value H, the output of each of NOR gates 448-450 is value L. So long as the signal on line CS_BAR is set to value H, the output of NOR gate 448 at node 460A will be value H regardless of whether the signal on line WD is set to value L or value H. Accordingly, in FIG. 4A, the value on signal on line WD is shown as L/H. Similarly, as the signal on line CS_BAR is set to value H, the output of NOR gate 450 at node 462A will be value H regardless of whether the signal on line WD_bar is set to value L or value H. Accordingly, in FIG. 4A, the value on signal on line WD_bar is shown as L/H.

Regarding g-col driver 424(j), when the output of NAND gate 448 at node 460A (which also is the input of inverter 440) has the value L, then the output of inverter 440 at node 460B has the value H. More particularly, when the input of inverter 440 at node 460A has the value L, transistor P05 is turned on and transistor N13 is turned off so that, correspondingly, VDD is connected to node 460A and VSS is disconnected/blocked from node 460A. Similarly, when the output of NAND gate 450 at node 462A (which also is the input of inverter 442) has the value L, then the output of inverter 442 at node 462B has the value H.

Also regarding g-col driver 424(j), when the outputs of each of NAND gates 448-450 at corresponding nodes 460A and 462A have the value L, then equalizer 425 is turned on. More particularly, when the inputs of inverters 440-442 at corresponding nodes 460A and 462A have the value L, then corresponding transistors P11-P12 are turned on such that LWB line 434(j) is connected to LWB_bar line 436(j), which facilitates equalizing voltage levels on LWB line 434(j) and LWB_bar line 436(j).

Regarding s-col driver 420(j), when the output of NAND gate 448 at node 460A (which also is the input at node 464A of inverter 444 of s-col driver 420A(j)) has the value L, then the output of inverter 444 at node 464B has the value H. Similarly, when the output of NAND gate 450 at node 462A (which also is the input at node 466A of inverter 446 of s-col driver 420A(j) has the value L, then the output of inverter 442 at node 462B has the value H.

Also regarding s-col driver 420A(j), when the inputs of inverters 444-446 at corresponding nodes 464A-466A have the value L, then equalizer 421 is turned on. More particularly, when the inputs of inverters 444-446 at corresponding nodes 464A-466A have the value L, then corresponding transistors P13-P14 are turned on such that LWB line 434(j) is connected to LWB_bar line 436(j), which facilitates equalizing voltage levels on LWB line 434(j) and LWB_bar line 436(j).

The discussion now turns to FIG. 4B (which assumes, again, a scenario in which column 407(j) is selected and in which column 407(j) is being pre-charged before a write operation). In FIG. 4B, a signal on line CS_BAR is set to value L. When the signal on line CS_BAR is set to value L, the output of each of NOR gates 448-450 depends on the values on corresponding lines WD and WD_bar. In FIG. 4B, each of lines WD and WD_bar has value H. Accordingly, the output of each of NOR gates 448-450 at corresponding nodes 460A and 462A is value L.

In FIG. 4B, regarding g-col driver 424(j), when the output of NAND gate 448 at node 460A (which also is the input of inverter 440) has the value L, then the signal propagation is similar to that of FIG. 4A (discussed above). This is because each of lines WD and WD_bar has value H in FIG. 4B while line CS_bar has the value L, whereas in FIG. 4A line CS_bar has the value H (such that it does not matter whether the signals on lines WD and WD_bar are set to value L or value H in FIG. 4A). Accordingly, in FIG. 4B, column 407(j) is selected, and LWB line 434(j) and LWB_bar line 436(j) are pre-charged to value H before a write operation occurs.

The discussion now turns to FIG. 4C (which assumes, again, a scenario in which column 407(j) is selected, and in which data is being written to column 407(j), after column 407(j) has been pre-charged). It is to be recalled that a bit cell, e.g., 412A(i,j) (but see 312A(i,j) for greater detail), stores a pair of opposite logical values (L & H or H & L) at the corresponding node pair, e.g., node 303A & node 303B. Accordingly, in order to write data to one of the cells in column 407(j), e.g., cell 412A(i,j), the values which c-drv control unit 426(i) outputs at corresponding nodes 460A and 462A are a pair of opposite logical values, either L & H or H & L.

FIG. 4C is similar to FIG. 4B except that, in FIG. 4C, the value on line WD is different than the value on line WD_bar, with the result that the value which c-drv control unit 426(i) outputs at node 460A is the logical opposite of the value which c-drv control unit 426(i) outputs at node 462A. Accordingly, in FIG. 4C, line WD is shown as having value L/H and line WD_bar is shown as having value H/L, and the values which c-drv control unit 426(i) outputs at corresponding nodes 460A and 462A are shown as H/L and L/H.

More particularly regarding c-drv control unit 426(i) in FIG. 4C, a signal on line CS_BAR is set to value L. When the signal on line CS_BAR is set to value L, the output of each of NOR gates 448-450 depends on the values on corresponding lines WD and WD_bar. In FIG. 4C, line WD has value L/H such that the output of NOR gate 448 at node 460A is H/L. Line WD_bar has value H/L such that the output of NOR gate 448 at node 462A is L/H.

Regarding g-col driver 424(j) in FIG. 4C, when the output of NAND gate 448 at node 460A (which also is the input of inverter 440) has the value H/L, then the output of inverter 440 at node 460B has the value L/H. More particularly, when the input of inverter 440 at node 460A has the value H, transistor P05 is turned off and transistor N13 is turned on so that, correspondingly, VDD is disconnected/blocked from node 460A and VSS is connected to node 460A. Alternatively, when the input of inverter 440 at node 460A has the value L, transistor P05 is turned on and transistor N13 is turned off so that, correspondingly, VDD is connected to node 460A and VSS is disconnected/blocked from node 460A. Similarly, when the output of NAND gate 450 at node 462A (which also is the input of inverter 442) has the value L/H, then the output of inverter 442 at node 462B has the value H/L.

Also regarding g-col driver 424(j), when the output of NAND gate 448 at node 460A and the output of NAND gate 450 at node 462A have different logical values, then equalizer 425 is turned off. More particularly, because transistors P11 and P12 are both PMOS transistors, one of P11 and P12 are turned off when corresponding nodes 460A and node 462A have different logical values. When the output of NAND gate 448 at node 460A has the value H/L, then transistor P11 is turned ON/OFF. When the output of NAND gate 450 at node 462A has the value L/H, then transistor P12 is turned OFF/ON. With equalizer 425 turned off, LWB line 434(j) is disconnected/blocked from LWB_bar line 436(j), which prevents equalizing voltage levels on LWB line 434(j) and LWB_bar line 436(j), and thereby facilitates the writing of a pair of opposite logical values (L & H or H & L) in a bit cell of column 407(j), e.g., 412A(i,j).

Regarding s-col driver 420A(j), when the output of NAND gate 448 at node 460A (which also is the input at node 464A of inverter 444 of s-col driver 420A(j) has the value H/L, then the output of inverter 444 at node 464B has the value L/H. Similarly, when the output of NAND gate 450 at node 462A (which also is the input at node 466A of inverter 446 of s-col driver 420A(j) has the value L/H, then the output of inverter 442 at node 462B has the value H/L.

Equalizer 421 of s-col driver 420A(j), is similar to equalizer 425. Accordingly, when the inputs of inverters 444 and 446 at corresponding nodes 464A and 466A have the corresponding values H/L and L/H, then equalizer 421 is turned off.

A circuit configuration can be described, e.g., in terms of the relative degrees of optimization of various parameter combinations which the circuit configuration represents. For example, speed is a parameter which represents operational speed of a corresponding circuit. In some embodiments, the relative degrees optimization of speed are referred to as low, moderate and high such that the corresponding circuit is configured to exhibit low speed, moderate speed or high speed, where low<moderate<high. As another example, footprint is a parameter which represents an area consumed/occupied by a corresponding circuit. In some embodiments, the relative degrees optimization of footprint are referred to as small, medium and large such that the corresponding circuit is configured to exhibit a small footprint, a medium footprint or a large footprint, where small<medium<large.

In some embodiments, certain relative optimizations of speed and footprint are referred to as types.

In some embodiments, maximum speed is a parameter representing maximum operational speed (Max Speed) of a corresponding circuit. In some embodiments, footprint is a parameter representing an area consumed by a corresponding circuit. In some embodiments, and as summarized in the following table (Table 1), a Type 1 configuration is configured for a moderate magnitude of Max Speed and a medium footprint, a Type 2 configuration is configured for a low magnitude of Max Speed and a small footprint, and a Type 3 configuration is configured for high magnitude of Max Speed and a large footprint. In some embodiments, the moderate magnitude of Max Speed is about halfway between the low magnitude of Max Speed and the high magnitude of Max Speed. In some embodiments, a difference between the low magnitude of Max Speed and the high magnitude of Max Speed is less than about 30%. In some embodiments, a difference between the small footprint and the large footprint is less than about 30%. In some embodiments, each of the difference between the low magnitude of Max Speed and the high magnitude of Max Speed and the difference between the small footprint and the large footprint is less than about 30%.

TABLE 1

| Type | Max Speed | Footprint |
|---|---|---|
| Type-1 | moderate | medium |
| Type-2 | low | small |
| Type-3 | high | large |

In FIGS. 3 and 4A-4C, each of s-col driver 320A(j), g-col-driver 324(j), s-col driver 420A(j) and g-col-driver 424(j) is shown as having the same internal configuration. More particularly, each of s-col driver 320A(j), g-col-driver 324(j), s-col driver 420A(j) and g-col-driver 424(j) is shown as having the Type-1 configuration. Accordingly, each of s-col driver 320A(j), g-col-driver 324(j), s-col driver 420A (j) and g-col-driver 424(j) is configured for moderate speed and a medium footprint. In some embodiments, the configuration of one or more of s-col driver 320A(j), g-col-driver 324(j), s-col driver 420A(j) and g-col-driver 424(j) is different than what is shown in FIGS. 3 and 4A-4C. For example, see FIGS. 5A-5C (discussed below).

Figure 5A:
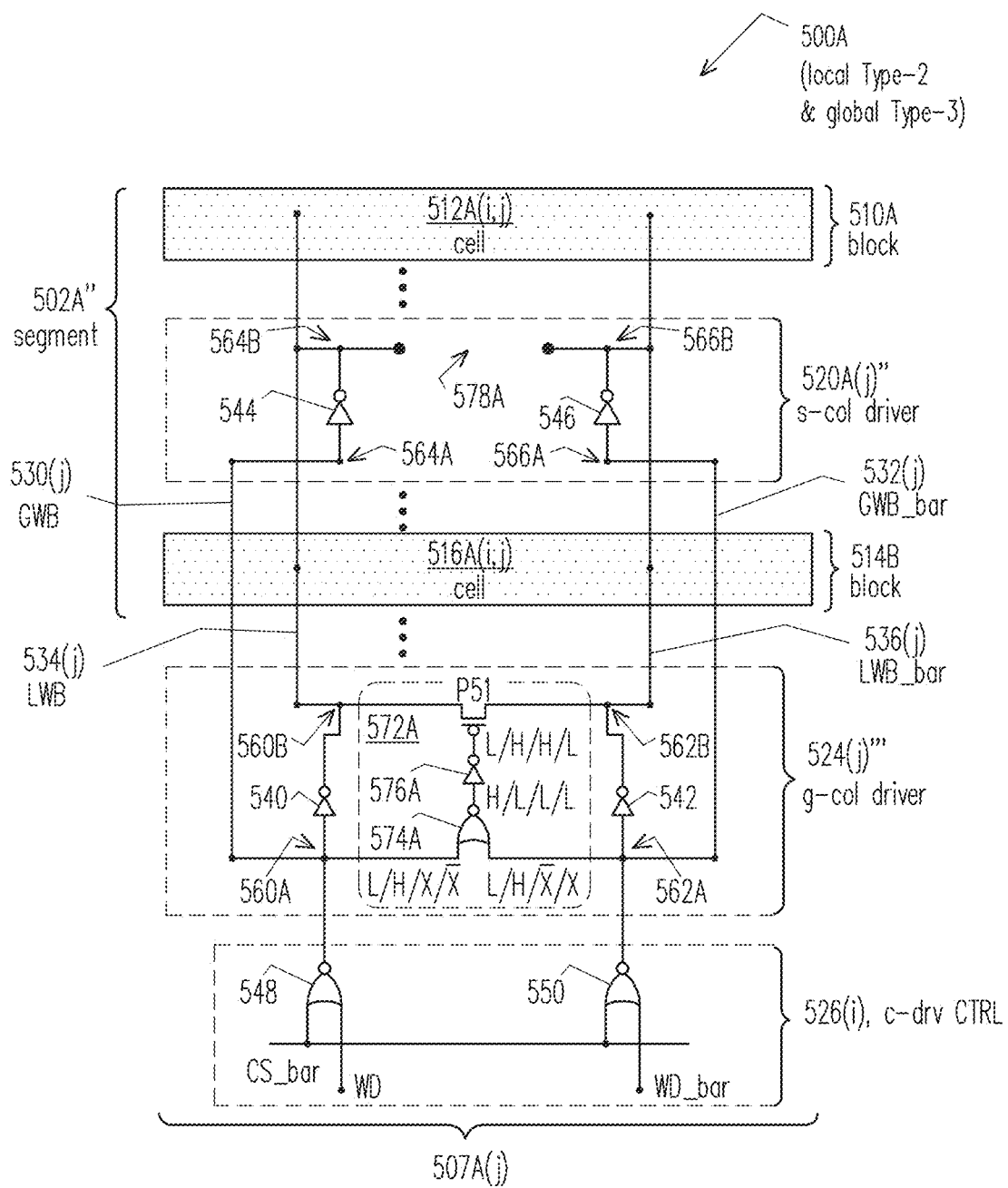
FIGS. 5A-5C are corresponding circuit diagrams of array & column driving regions, each of which includes a distributed write driving arrangement, in accordance with corresponding embodiments of the present disclosure.
Figure 5B:
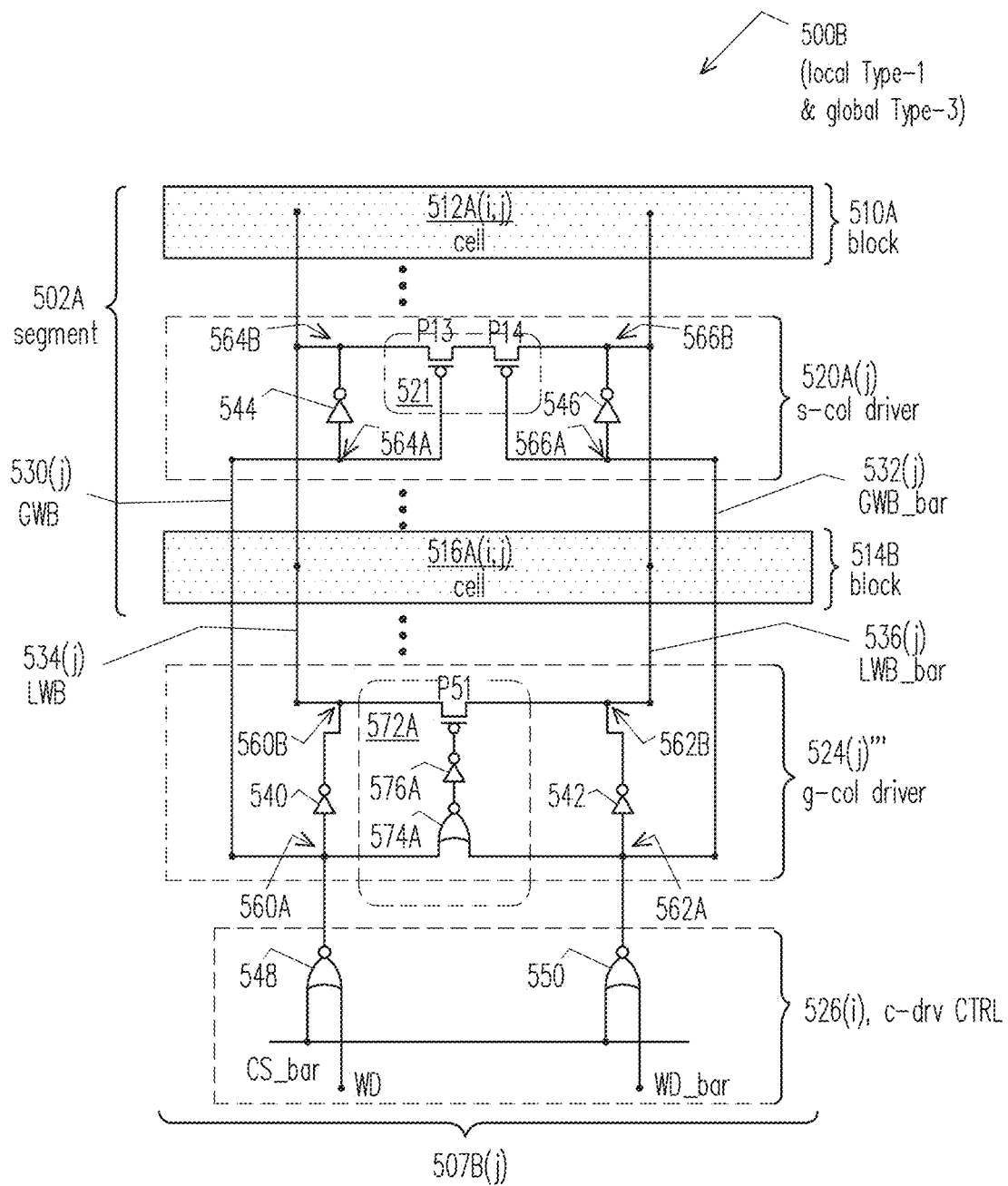
Figure 5C:
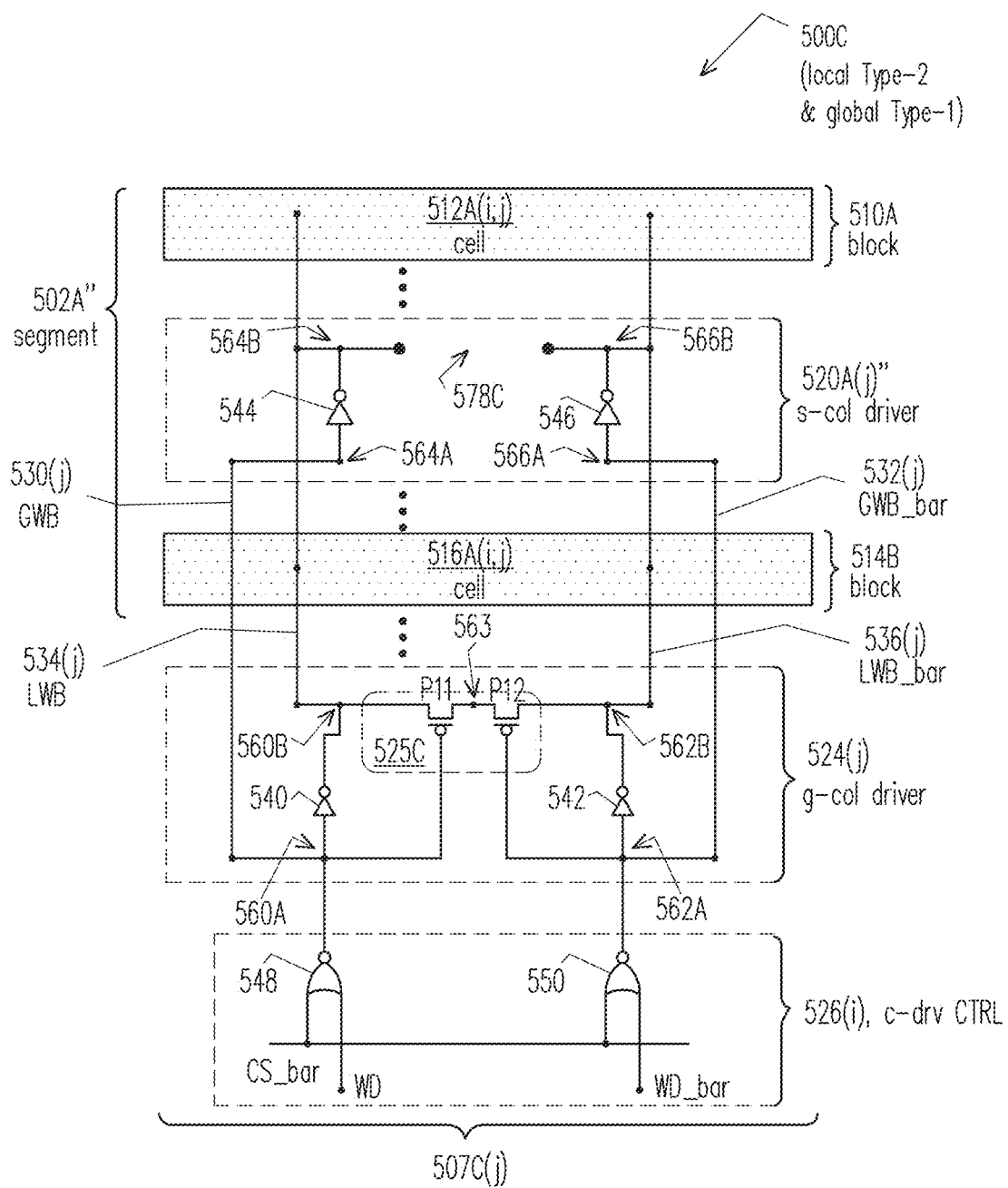

FIGS. 5A-5C are corresponding circuit diagrams 500A-500C of array & column driving regions, each of which includes a distributed write driving arrangement, in accordance with corresponding embodiments of the present disclosure.

Each of circuit diagrams 500A-500C is an example implementation of array & column driving region 200 of FIG. 2. As such, each of circuit diagrams 500A-500C is an example of region 104 of FIG. 1.

Each of circuit diagrams 500A-500C of corresponding FIGS. 5A-5C is an example variant of circuit diagrams 400A-400C of FIGS. 4A-4C. It is to be recalled that each of circuit diagrams 400A-400C shows the same circuit in different control phases of column 407(j) of the array & column driving region. For purposes of brevity, the discussion of circuits 500A-500C will focus on differences with respect to circuit diagrams 400A-400C of FIGS. 4A-4C.

In FIG. 5A, s-col driver 520A(j)" and g-col driver 524(j)''' differ from corresponding s-col driver 420A(j) and g-col driver 424(j) of FIGS. 4A-4C.

In circuit diagram 500A, s-col driver 520A(j)" does not include an equalizer that otherwise would correspond to equalizer 421 of s-col driver 420A(j). Instead, there is a gap/break 578A between nodes 564B and 566B in s-col driver 420A(j). In terms of type, s-col driver 520A(j)" is shown as having the Type-2 configuration, where the double apostrophe (") in reference number 520A(j)" indicates Type-2. Accordingly, s-col driver 520A(j) is configured for low speed and a small footprint.

Also in circuit diagram 500A, g-col driver 524(j)''' includes an equalizer 572A rather than equalizer 425 of g-col driver 424(j).

Equalizer 572A is connected between LWB line 534(j) at node 560B and LWB_bar line 536(j) at node 562B. Equalizer 572A includes a PMOS transistor P51, a NOR gate 574A and an inverter 576A. PMOS transistor P51 is connected between LWB line 534(j) at node 560B and LWB_bar line 536(j) at node 562B. The gate electrode of transistor P51 is connected to the output of inverter 576A. The input of inverter 576A is connected to the output of NOR gate 574A. The first and second inputs of NOR gate 574A are connected to corresponding nodes 560A and 562A. In terms of type, g-col driver 524(j)''' is shown as having the Type-3 configuration, where the triple apostrophe (''') in reference number 524(j)''' indicates Type-3. Accordingly, g-col driver 524(j)''' is configured for high speed and a large footprint.

In terms of how the values on corresponding nodes 560A and 562A turn on/off equalizer 572A, equalizer 572A operates the same as equalizer 425 of FIGS. 4A-4C. Because the inclusion of NOR gate 574A reflects an 'active-low' configuration, when each of nodes 560A and 562A has value L, then the output of NOR gate 574A has value H and the gate electrode of transistor P51 has value L, which turns on transistor P51. Any other combination of values on nodes 560A and 562A produces results in the output of NOR gate 574A having value L and the gate electrode of transistor P51 having value H, which turns off transistor P51. Accordingly, in FIG. 5A, the values on nodes 560A and 562A are correspondingly shown as L/H/X/X and L/H/X/X.

FIG. 5B is similar to FIGS. 4A-4C in some respects and is similar to FIG. 5A in some respects. In FIG. 5B, s-col driver 520A(j) is the same as s-col driver 420A(j) in FIGS. 4A-4C. Also in FIG. 5B, g-col driver 524(j)''' is the same as g-col driver 524(j)''' in FIG. 5A.

FIG. 5C is similar to FIGS. 4A-4C in some respects and is similar to FIG. 5A in some respects. In FIG. 5C, s-col driver 520A(j)" is the same as s-col driver 520A(j)" in FIG. 5A. Also in FIG. 5C, g-col driver 524(j) is the same as g-col driver 424(j) in FIGS. 4A-4C.

In terms of the types summarized in Table 1, the combinations of types shown in FIGS. 3, 4A-4C and 5A-5C are summarized in the following table (Table 2).

TABLE 2

| | | | medium footprint moderate max speed Type 1 | small footprint low max speed Type 2 | large footprint high max speed Type 3 | s-col driver |
|---|---|---|---|---|---|---|
| medium footprint | moderate max speed | Type 1 | FIGS. 3 and 4A-4C | | FIG. 5C | |
| small footprint | low max speed | Type 2 | | | | |
| large footprint | high max speed | Type 3 | | FIG. 5B | FIG. 5A | |
| | | | g-col driver | | | |

In some embodiments, certain relative optimizations of speed and footprint are summarized in the following table (Table 3).

TABLE 3

| | | ≈same footprint ≈same max speed | smaller footprint lower max speed | s-col driver |
|---|---|---|---|---|
| ≈same footprint | ≈same max speed | FIGS. 3 and 4A-4C | | |

TABLE 3-continued

| | | ≈same footprint ≈same max speed | smaller footprint lower max speed | s-col driver |
|---|---|---|---|---|
| larger footprint | higher max speed | | | FIGS. 5A-5C |
| | | g-col driver | | |

Relative to Table 3, in FIGS. 3 and 4A-4C, each of s-col driver 320A(j), g-col-driver 324(j), s-col driver 420A(j) and g-col-driver 424(j) is configured for substantially the same maximum speed, and each of s-col driver 320A(j), g-col-driver 324(j), s-col driver 420A(j) and g-col-driver 424(j) is configured with substantially the same footprint. In FIG. 5A, s-col driver 520A(j)″ is configured for a lower maximum speed as compared to g-col driver 524(j)′″, and s-col driver 520A(j)″ is configured with a smaller footprint as compared to g-col driver 524(j)′″. In FIG. 5B, s-col driver 520A(j) is configured for a lower maximum speed as compared to g-col driver 524(j)′″, and s-col driver 520A(j)″ is configured with a smaller footprint as compared to g-col driver 524(j)′″. In FIG. 5C, s-col driver 520A(j)″ is configured for a lower maximum speed as compared to g-col driver 524(j), and s-col driver 520A(j)″ is configured with a smaller footprint as compared to g-col driver 524(j)′″.

Figure 6:
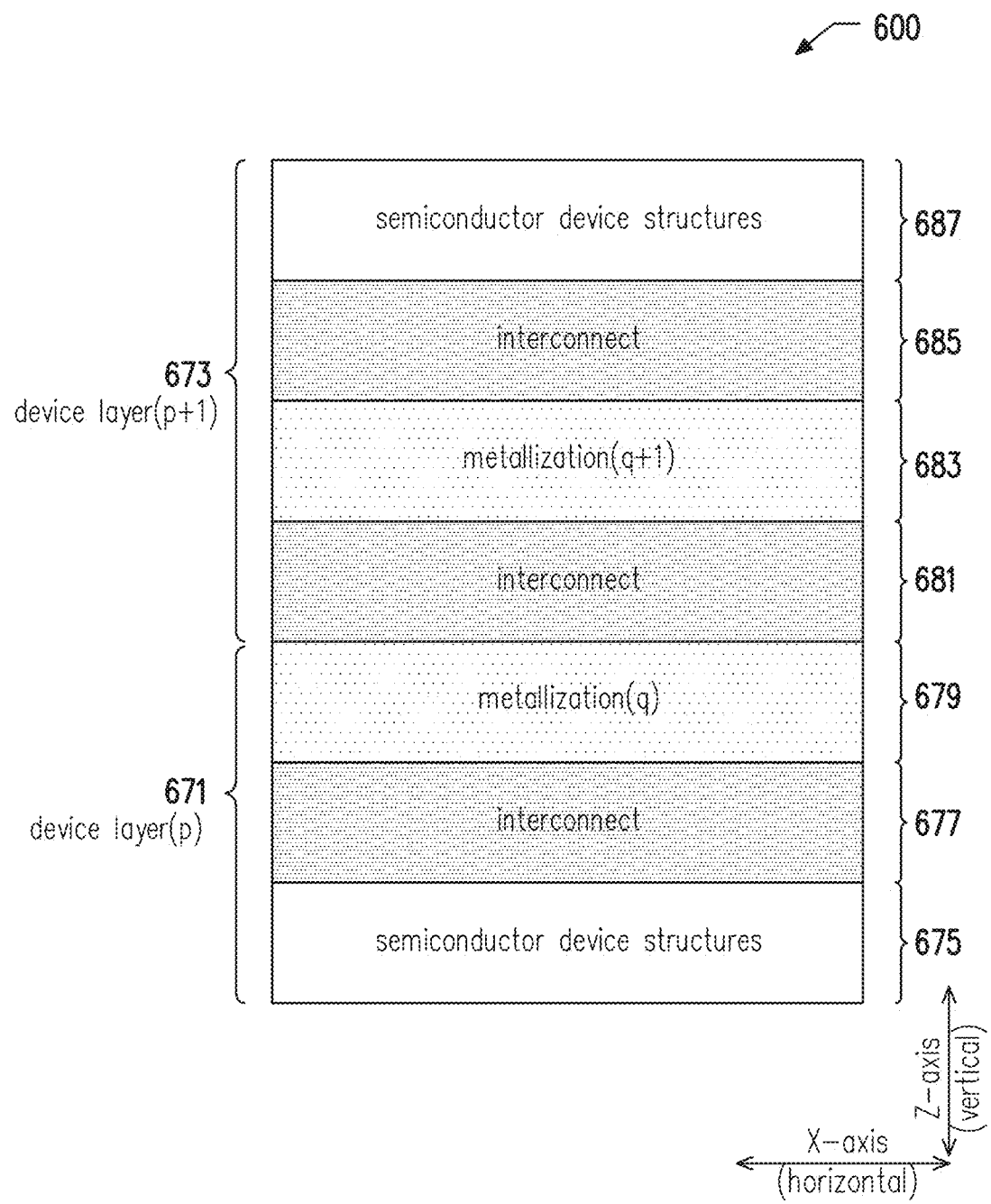
FIG. 6 is a cross-section of an array & column driving region 600 which includes a distributed write driving arrangement, in accordance with at least one embodiment of the present disclosure.

FIG. 6 is a cross-section of an array & column driving region 600 which includes a distributed write driving arrangement, in accordance with at least one embodiment of the present disclosure. As such, region 600 of FIG. 6 is an example of region 104 of FIG. 1. In some embodiments, each of circuit diagrams 300, 400A-400C and 500A-500C have cross-sections corresponding to FIG. 6.

FIG. 6 includes layers 671 and 673. Layer 673 is on layer 671. Layer 671 is a $p^{th}$ layer (layer(p)) of devices (not shown), where p is an integer and p≥0. Layer 673 is a $(p+1)^{th}$ layer (layer(p+1) of devices (not shown).

Examples of devices included in device layer(p) 671 include: segments 202A and 202B of FIG. 2, which include corresponding s-col drivers 220A(j)-220(j+n) and 220B(j)-220B(j+n); segment 302A of FIG. 3, which includes s-col driver 320A(j); segment 402A of FIGS. 4A-4C, which includes s-col driver 420A(j); segments 502A″ of FIGS. 5A and 5C, which include s-col driver 520A(j)″; and segment 502A of FIG. 5B, which include s-col driver 520A(j).

Examples of devices included in device layer(p+1) 673 include: g-col drivers 224(j)-224(j+n) and c-drv control units 226(j)-226(j+n) of FIG. 2; g-col driver 324(j) and c-drv control unit 326(j) of FIG. 3; g-col driver 424(j) and c-drv control unit 426(j) of FIGS. 4A-4C; g-col driver 524(j)′″ of FIGS. 5A-5B; g-col driver 524(j) of FIG. 5C; and c-drv control unit 526(j) of FIGS. 5A-5C.

Device layer(p) 671 includes sublayers 675-679. Sublayer 677 is on sublayer 675. Sublayer 679 is on sublayer 677. Device layer(p+1) 673 includes sublayers 681-687. Sublayer 683 is on sublayer 681. Sublayer 685 is on sublayer 683. Sublayer 687 is on sublayer 685.

Sublayer 679 is a $q^{th}$ sublayer (sublayer(q)) of metallization, where q is an integer and q≥0. In some embodiments, the $q^{th}$ sublayer is the first sublayer of metallization, in which case q=0 or q=1 depending upon the numbering convention of the corresponding design rules. Sublayer 683 is a $(q+1)^{th}$ sublayer (sublayer(q+1)) of metallization. In some embodiments, metallization sublayer(q) 679 also includes one or more interconnects (not shown), e.g., one or more vias. In some embodiments, metallization sublayer(q+1) 683 also includes one or more interconnects (not shown), e.g., one or more vias.

Sublayer 675 includes semiconductor structures (not shown), e.g., active regions or the like. Sublayer 677 is an interconnect sublayer which includes interconnects (not shown), e.g., vias. The vias of interconnect sublayer 677 connect semiconductor structures of sublayer 675 to corresponding conductors (not shown) in metallization sublayer (q) 679. At least some of the devices of layer(p) 671 include one or more semiconductor structures of sublayer 675, one or more vias of interconnect sublayer 677 and one or more conductors of metallization sublayer(q) 679.

Sublayer 687 includes semiconductor structures (not shown), e.g., active regions or the like. Sublayers 681 and 685 are interconnect sublayers, each of which includes interconnects (not shown), e.g., vias. The vias of interconnect sublayer 681 connect conductors (not shown) in metallization sublayer(q+1) to corresponding conductors (not shown) in metallization sublayer(q) 679. The vias of interconnect sublayer 685 connect semiconductor structures of sublayer 687 to corresponding conductors (not shown) in metallization sublayer(q+1) 683. At least some of the devices of layer(p+1) 671 include one or more semiconductor structures of sublayer 687, one or more vias of interconnect sublayer 685 and one or more conductors of metallization sublayer(q) 683.

In array & column driving region 600 of FIG. 6, device layer(p+1) 673 is less densely populated than device layer(p) 671. Accordingly, as contrasted with device layer(p) 671, device layer(p+1) 673 more easily accommodates circuits with Type-1 configurations (moderate speed and medium footprint) than does device layer(p) 671, and yet more easily accommodates circuits with Type-3 configurations (high speed and large footprint) than does device layer(p) 671.

In some embodiments, device layer(p+1) 673 includes Type-1 and/or Type-3 but not Type-2 configurations of circuits, whereas layer(p) 671 includes Type-1 and/or Type-2 but not Type-3 configurations of circuits. In some embodiments, device layer(p+1) 673 includes Type-3 configurations but not Type-1 and/or Type-2 configurations of circuits, whereas layer(p) 671 includes Type-2 configurations but not Type-1 and/or Type-3 configurations of circuits. In some embodiments, device layer(p+1) 673 includes Type-1 configurations but not Type-2 and/or Type-3 configurations of circuits, whereas layer(p) 671 includes Type-1 configurations but not Type-2 and/or Type-3 configurations of circuits. Other configurations are within the scope of the disclosure.

Figure 7:
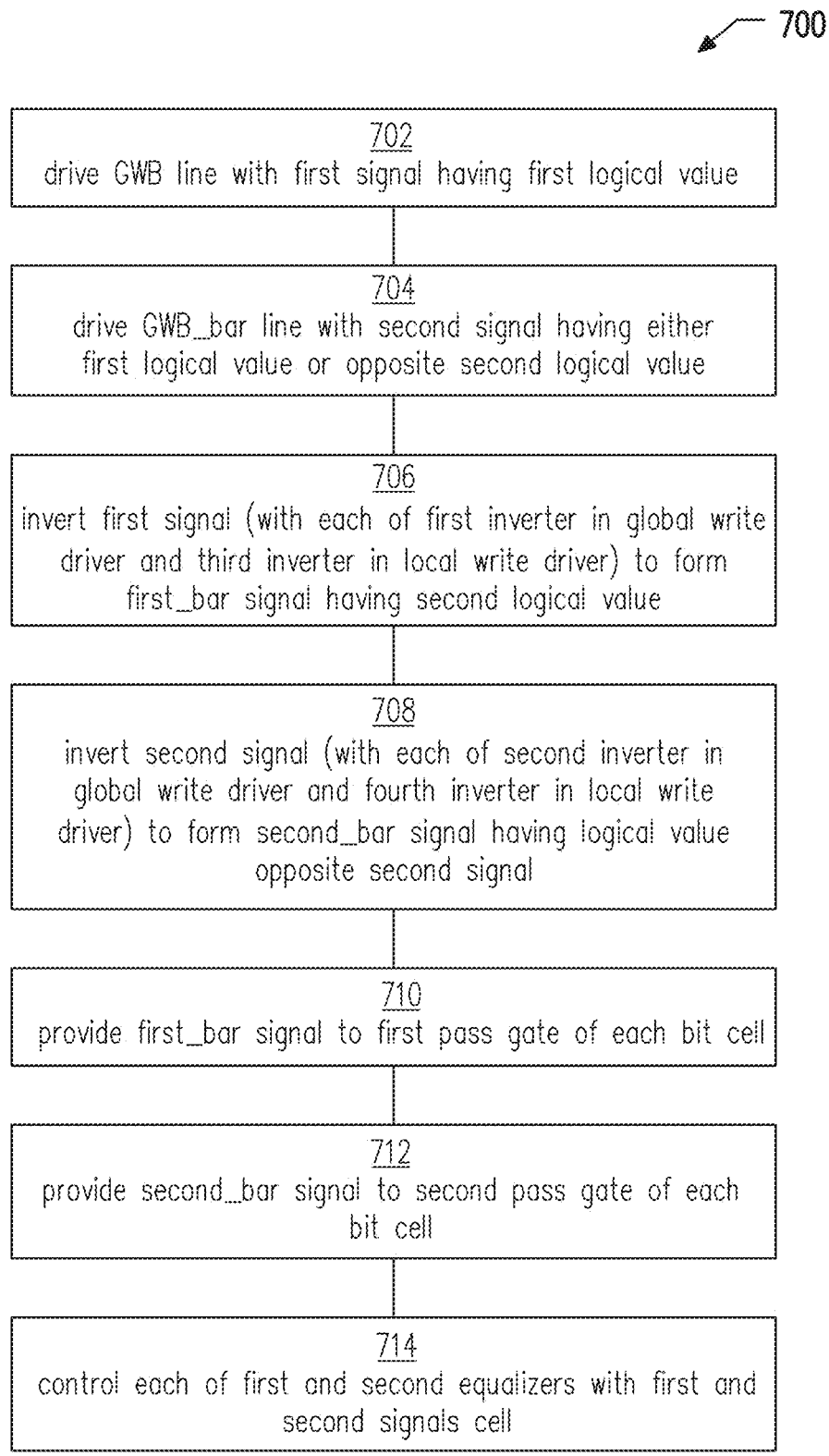
FIG. 7 is a flowchart of a method 700 of write-driving a column in an array & column driving region of a SRAM macro on a distributed basis, in accordance with some embodiments.

FIG. 7 is a flowchart of a method 700 of write-driving a column in an array & column driving region of a SRAM macro on a distributed basis, in accordance with some embodiments.

Method 700 is implementable, for example, using circuits such as those in FIGS. 4A-4C, 5A-5C, or the like, in accordance with some embodiments.

Regarding method 700, an example of the SRAM macro is SRAM macro 102. Examples of the column and the corresponding an array & column driving region include: columns 207(j)-207(j+n) in region 200 of FIG. 2; column 307(j) in circuit diagram 300 of FIG. 3; column 407(j) in circuit diagrams 400A-400C of FIGS. 4A-4C; and columns 507A(j)-507C(j) in corresponding circuit diagrams 500A-500C of corresponding FIGS. 5A-5C.

In FIG. 7, method 700 includes blocks 702-714. At block 702, a GWB line is driven with a first signal having a first logical value. An example of the GWB line is GWB line

430(*j*) in FIGS. 4A-4C. An example of the first signal having the first state is the signal on node 460A in FIGS. 4A-4B, which has the value L. An example of the first signal having the first state is the signal on node 460A in FIG. 4C, which has the value L/H (see FIG. 4C, discussed above). From block 702 flow proceeds to block 704.

At block 704, a GWB_bar line is driven with a second signal which has either the first logical value or a second logical value opposite to the first logical value. An example of the GWB_bar line is GWB_bar line 432(*j*) in FIGS. 4A-4C. An example of the second signal having the first state is the signal on node 462A in FIGS. 4A-4B, which has the value L. Another example of the first signal having the second state is the signal on node 462A in FIG. 4C, which has the value H/L (see FIG. 4C, discussed above). From block 704, flow proceeds to block 706.

At block 706, using each of a first inverter in a global write driver and a third inverter in a local write driver, the first signal is inverted to form a first_bar signal having the second logical value. An example of the first inverter in the global write driver is inverter 440 in FIGS. 4A-4C. An example of the third inverter in the local write driver is inverter 444 in FIGS. 4A-4C. An example of the first_bar signal having the second logical value is the signal on node 460B in FIGS. 4A-4B, which has the value H. Another example of the first signal having the second state is the signal on node 460B in FIG. 4C, which has the value L/H (see FIG. 4C, discussed above). From block 706, flow proceeds to block 708.

At block 708, using each of a second inverter in a global write driver and a fourth inverter in a local write driver, the second signal is inverted to form a second_bar signal having a logical value opposite the logical value of the second signal. An example of the second inverter in the global write driver is inverter 442 in FIGS. 4A-4C. An example of the fourth inverter in the local write driver is inverter 446 in FIGS. 4A-4C. An example of the second_bar signal is the signal on node 462B in FIGS. 4A-4B, which has the value H. Another example of the second_bar signal is the signal on node 462B in FIG. 4C, which has the value H/L (see FIG. 4C, discussed above). From block 708, flow proceeds to block 710.

At block 710, the first_bar signal is provided to a first pass gate of each of the bit cells. Examples of the bit cells are bit cells 420A(i,j) and 416A(i,j) in FIGS. 4A-4C. An example of the first_bar signal being provided to the first pass gate of a bit cell is the signal on nodes 405A and 403A in FIGS. 4A-4C. From block 710, flow proceeds to block 712.

At block 712, the second_bar signal is provided to a second pass gate of each of the bit cells. Again, examples of the bit cells are bit cells 420A(i,j) and 416A(i,j) in FIGS. 4A-4C. An example of the second_bar signal being provided to the second pass gate of a bit cell is the signal on nodes 405B and 403B in FIGS. 4A-4C. From block 712, flow proceeds to block 714.

At block 714, each of the first and second equalizers is controlled with the first and second signals. Examples of the first and second equalizers are corresponding equalizers 425 and 421 in FIGS. 4A-4C.

In some embodiments, block 714 includes: turning off each of the first equalizer circuit and the second equalizer circuit when the first and second signals have different logical values, an example of which is shown in FIG. 4C.

In some embodiments, block 714 includes: providing the first signal to gates of a first and third transistor; and providing the second signal to gates of a second and fourth transistor. Examples of the first to fourth transistors are corresponding transistors P11-P14 of FIGS. 4A-4C, the gates of which are connected to corresponding nodes 460A, 462A, 464A and 466A.

In some embodiments, block 714 includes: logically combining the first and second signals to form a third signal; and providing the third signal to a gate of a first transistor. An example of the transistor is transistor P51 in FIG. 5A. An example of logically combining the first and second signals to form a third signal is providing the signals on nodes 560A and 562A to NOR gate 574A and inverting the output of NOR gate 574A with inverter 576A, where the third signal is formed at the output of inverter 576A. An example of providing the third signal to a gate of a first transistor is providing the signal on the output of inverter 576A to the gate of transistor P51.

In some embodiments, a semiconductor memory device includes: a local write bit (LWB) line; a local write bit_bar (LWB_bar) line; a global write bit (GWB) line; a global write bit_bar (GWBL_bar) line; a column of segments, each segment including bit cells; each of the bit cells being connected correspondingly between the LWB and LWB_bar lines; and a distributed write driving arrangement including a global write driver and local write drivers included correspondingly in the segments; and the global write driver including a first equalizer circuit, arranged in a switched-coupling between the LWB line and the LWB_bar line, and arranged in a control-coupling with respect to signals correspondingly on the GWB line and the GWB_bar line, and the global write driver and the local write drivers each including first and second inversion couplings, the first inverter couplings being coupled in parallel between the GWB line and the LWB line, and the second inversion couplings being coupled in parallel between the GWB_bar line and the LWB_bar line.

In some embodiments, each local write driver is free from having a corresponding equalizer circuit connected between the LWB line and the LWB_bar line.

In some embodiments, the first equalizer circuit includes a logic-coupling connected between a control input of the switched-coupling and each of the GWB line and the GWB_bar line.

In some embodiments, the global write driver further includes a transistor connected in series between the LWB line and the LWB_bar line.

In some embodiments, the logic-coupling is configured to apply a logical OR function to a gate terminal of the transistor.

In some embodiments, the first equalizer circuit includes a third inversion coupling between the logic-coupling and the switched-coupling.

In some embodiments, each of the bit cells includes: a latch circuit; and first and second pass gates connecting the corresponding LWB and LWB_bar lines to the latch circuit.

In some embodiments, each of the bit cells is an eight transistor (8T) type of static random access memory (SRAM) cell.

In some embodiments, a semiconductor memory device includes: a local write bit (LWB) line; a local write bit_bar (LWB_bar) line; a global write bit (GWB) line; a global write bit_bar (GWBL_bar) line; a column of segments, each segment including bit cells; each of the bit cells being connected correspondingly between the LWB and LWB_bar lines; and a distributed write driving arrangement including a global write driver and local write drivers included correspondingly in the segments; the global write driver including a first equalizer circuit, arranged in a switched-coupling between the LWB line and the LWB_bar line, and arranged in a control-coupling with respect to signals correspondingly on the GWB line and the GWB_bar line; the global write driver and the local write drivers each including first and second inversion couplings, the first inverter couplings being coupled in parallel between the GWB line and the LWB line, and the second inversion couplings being coupled in parallel between the GWB_bar line and the LWB_bar line; and each local write driver is free from having a corresponding equalizer circuit connected between the LWB line and the LWB_bar line.

In some embodiments, the first equalizer circuit includes a logic-coupling connected between a control input of the switched-coupling and each of the GWB line and the GWB_bar line.

In some embodiments, the global write driver further includes a transistor connected in series between the LWB line and the LWB_bar line.

In some embodiments, the logic-coupling is configured to apply a logical OR function to a gate terminal of the transistor.

In some embodiments, the first equalizer circuit includes: a third inversion coupling between the logic-coupling and the switched-coupling.

In some embodiments, each of the bit cells includes: a latch circuit; and first and second pass gates connecting the corresponding LWB and LWB_bar lines to the latch circuit.

In some embodiments, each of the bit cells is an eight transistor (8T) type of static random access memory (SRAM) cell.

In some embodiments, a semiconductor memory device includes: a local write bit (LWB) line; a local write bit_bar (LWB_bar) line; a global write bit (GWB) line; a global write bit_bar (GWBL_bar) line; a column of segments, each segment including bit cells, each of the bit cells being an eight transistor (8T) type of static random access memory (SRAM) cell; each of the bit cells being connected correspondingly between the LWB and LWB_bar lines; and a distributed write driving arrangement including a global write driver and local write drivers included correspondingly in the segments; and the global write driver including a first equalizer circuit, arranged in a switched-coupling between the LWB line and the LWB_bar line, and arranged in a control-coupling with respect to signals correspondingly on the GWB line and the GWB_bar line; and the global write driver and the local write drivers each including first and second inversion couplings, the first inverter couplings being coupled in parallel between the GWB line and the LWB line, and the second inversion couplings being coupled in parallel between the GWB_bar line and the LWB_bar line.

In some embodiments, each local write driver is free from having a corresponding equalizer circuit connected between the LWB line and the LWB_bar line.

In some embodiments, the first equalizer circuit includes a logic-coupling connected between a control input of the switched-coupling and each of the GWB line and the GWB_bar line.

In some embodiments, the global write driver further includes a transistor connected in series between the LWB line and the LWB_bar line.

In some embodiments, the logic-coupling is configured to apply a logical OR function to a gate terminal of the transistor.

In some embodiments, the first equalizer circuit includes a third inversion coupling between the logic-coupling and the switched-coupling.

In some embodiments, each of the bit cells includes: a latch circuit; and first and second pass gates connecting the corresponding LWB and LWB_bar lines to the latch circuit.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor memory device comprising:
   a local write bit (LWB) line;
   a local write bit_bar (LWB_bar) line;
   a global write bit (GWB) line;
   a global write bit_bar (GWB_bar) line;
   a column of segments, each segment including bit cells;
   each of the bit cells being connected correspondingly between the LWB and LWB_bar lines; and
   a distributed write driving arrangement including:
      a global write driver; and
      local write drivers included correspondingly in the segments; and
   the global write driver including:
      a first equalizer circuit, arranged in a switched-coupling between the LWB line and the LWB_bar line, and arranged in a control-coupling with respect to signals correspondingly on the GWB line and the GWB_bar line; and
   the global write driver and the local write drivers each including first and second inversion couplings, the first inversion couplings being coupled in parallel between the GWB line and the LWB line, and the second inversion couplings being coupled in parallel between the GWB_bar line and the LWB_bar line.

2. The semiconductor memory device of claim 1, wherein:
   each local write driver is free from having a corresponding equalizer circuit connected between the LWB line and the LWB_bar line.

3. The semiconductor memory device of claim 1, wherein the first equalizer circuit includes:
   a logic-coupling connected between a control input of the switched-coupling and each of the GWB line and the GWB_bar line.

4. The semiconductor memory device of claim 3, the global write driver further includes:
   a transistor connected in series between the LWB line and the LWB_bar line.

5. The semiconductor memory device of claim 4, wherein:
   the logic-coupling is configured to apply a logical OR function to a gate terminal of the transistor.

6. The semiconductor memory device of claim 3, wherein the first equalizer circuit includes:
   a third inversion coupling between the logic-coupling and the switched-coupling.

7. The semiconductor memory device of claim 1, wherein each of the bit cells includes:
   a latch circuit; and
   first and second pass gates connecting the corresponding LWB and LWB_bar lines to the latch circuit.

8. The semiconductor memory device of claim 1, wherein:
   each of the bit cells is an eight transistor (8T) type of static random access memory (SRAM) cell.

9. A semiconductor memory device comprising:
   a local write bit (LWB) line;
   a local write bit_bar (LWB_bar) line;
   a global write bit (GWB) line;
   a global write bit_bar (GWB_bar) line;
   a column of segments, each segment including bit cells;
   each of the bit cells being connected correspondingly between the LWB and LWB_bar lines; and
   a distributed write driving arrangement including:
      a global write driver; and
      local write drivers included correspondingly in the segments;
   the global write driver including:
      a first equalizer circuit, arranged in a switched-coupling between the LWB line and the LWB_bar line, and arranged in a control-coupling with respect to signals correspondingly on the GWB line and the GWB_bar line; and
   the global write driver and the local write drivers each including first and second inversion couplings, the first inversion couplings being coupled in parallel between the GWB line and the LWB line, and the second inversion couplings being coupled in parallel between the GWB_bar line and the LWB_bar line; and
   each local write driver is free from having a corresponding equalizer circuit connected between the LWB line and the LWB_bar line.

10. The semiconductor memory device of claim 9, wherein the first equalizer circuit includes:
   a logic-coupling connected between a control input of the switched-coupling and each of the GWB line and the GWB_bar line.

11. The semiconductor memory device of claim 10, the global write driver further includes:
   a transistor connected in series between the LWB line and the LWB_bar line.

12. The semiconductor memory device of claim 11, wherein:
   the logic-coupling is configured to apply a logical OR function to a gate terminal of the transistor.

13. The semiconductor memory device of claim 10, wherein the first equalizer circuit includes:
   a third inversion coupling between the logic-coupling and the switched-coupling.

14. The semiconductor memory device of claim 9, wherein each of the bit cells includes:
   a latch circuit; and
   first and second pass gates connecting the corresponding LWB and LWB_bar lines to the latch circuit.

15. The semiconductor memory device of claim 9, wherein:
   each of the bit cells is an eight transistor (8T) type of static random access memory (SRAM) cell.

16. A semiconductor memory device comprising:
   a local write bit (LWB) line;
   a local write bit_bar (LWB_bar) line;
   a global write bit (GWB) line;
   a global write bit_bar (GWB_bar) line;
   a column of segments, each segment including bit cells, each of the bit cells being an eight transistor (8T) type of static random access memory (SRAM) cell;
   each of the bit cells being connected correspondingly between the LWB and LWB_bar lines; and
   a distributed write driving arrangement including:
      a global write driver; and
      local write drivers included correspondingly in the segments;
   the global write driver including:
      a first equalizer circuit, arranged in a switched-coupling between the LWB line and the LWB_bar line, and arranged in a control-coupling with respect to signals correspondingly on the GWB line and the GWB_bar line; and
   the global write driver and the local write drivers each including first and second inversion couplings, the first inversion couplings being coupled in parallel between the GWB line and the LWB line, and the second inversion couplings being coupled in parallel between the GWB_bar line and the LWB_bar line.

17. The semiconductor memory device of claim 16, wherein:
   each local write driver is free from having a corresponding equalizer circuit connected between the LWB line and the LWB_bar line.

18. The semiconductor memory device of claim 16, wherein the first equalizer circuit includes:
   a logic-coupling connected between a control input of the switched-coupling and each of the GWB line and the GWB_bar line.

19. The semiconductor memory device of claim 18, the global write driver further includes:
   a transistor connected in series between the LWB line and the LWB_bar line.

20. The semiconductor memory device of claim 16, wherein each of the bit cells includes:
   a latch circuit; and
   first and second pass gates connecting the corresponding LWB and LWB_bar lines to the latch circuit.

* * * * *